US008094052B2

(12) United States Patent
Dabag et al.

(10) Patent No.: US 8,094,052 B2
(45) Date of Patent: Jan. 10, 2012

(54) CIRCUIT AND METHOD FOR DYNAMICALLY SELECTING CIRCUIT ELEMENTS

(75) Inventors: Hayg-Taniel Dabag, Bochum (DE); Dongwon Seo, San Diego, CA (US); Gene H. McAllister, La Mesa, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 127 days.

(21) Appl. No.: 11/759,750

(22) Filed: Jun. 7, 2007

(65) Prior Publication Data

US 2008/0272948 A1 Nov. 6, 2008

Related U.S. Application Data

(60) Provisional application No. 60/915,906, filed on May 3, 2007.

(51) Int. Cl.
*H03M 1/66* (2006.01)
(52) U.S. Cl. .......................................... 341/144; 375/216
(58) Field of Classification Search .................. 341/144, 341/143; 375/216
See application file for complete search history.

(56) References Cited

U.S. PATENT DOCUMENTS

| 6,348,884 | B1 | 2/2002 | Steensgaard-Madsen | |
| 6,469,648 | B2 * | 10/2002 | Nakao et al. .................. | 341/153 |
| 6,690,313 | B1 * | 2/2004 | Warren et al. ................. | 341/144 |
| 6,762,702 | B2 * | 7/2004 | Kwan ............................ | 341/143 |
| 6,952,123 | B2 * | 10/2005 | Kizer et al. ................... | 327/147 |
| 2005/0040979 | A1 * | 2/2005 | Brooks et al. ................ | 341/144 |

FOREIGN PATENT DOCUMENTS

| EP | 1179889 A1 | 2/2002 |
| TW | 200424887 | 11/2004 |

OTHER PUBLICATIONS

Carley, et al.: "A 16-Bit 4th Order Noise-Shaping D/A Converter," Proceeding of the IEEE 1988 Custom Integrated Circuits Conference, Department of Electrical Computer Engineering, Carnegie Mellon University, pp. 21.7.1-21.7.4, XP010075742, May 16-19, 1988.
International Search Report-PCT/US2008/062515, International Searching Authority-European Patent Office—Sep. 3, 2008.
Written Opinion—PCT/US2008/062515, International Searching Authority-European Patent Office—Sep. 3, 2008.
Taiwan Search Report—TW097116359—TIPO—Jul. 25, 2011.

* cited by examiner

*Primary Examiner* — Joseph Lauture
(74) *Attorney, Agent, or Firm* — Ramin Mobarhan

(57) ABSTRACT

Techniques for dynamically selecting circuit elements to combat mismatches are described. In one design, an apparatus includes first, second, and third circuits. The first circuit receives input data and provides first signals that are asserted based on the input data, e.g., with thermometer decoding. The second circuit receives the first signals and provides second signals used to select circuit elements, e.g., current sources, capacitors, resistors, etc. The third circuit generates a control for the second circuit, and the second circuit maps the first signals to the second signals based on this control. In one design, the second circuit includes a set of multiplexers and a control circuit. The multiplexers provides the first signals, circularly rotated by an amount determined by the control, as the second signals. The control circuit accumulates control data (e.g., the input data, pseudo-random data, or a fixed value) with the current control value to obtain new control value.

28 Claims, 8 Drawing Sheets

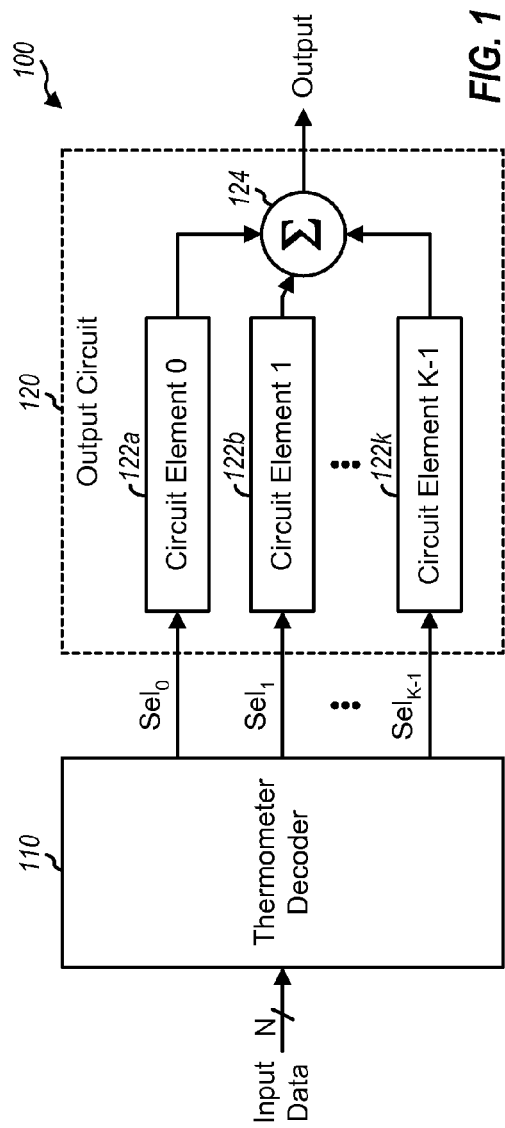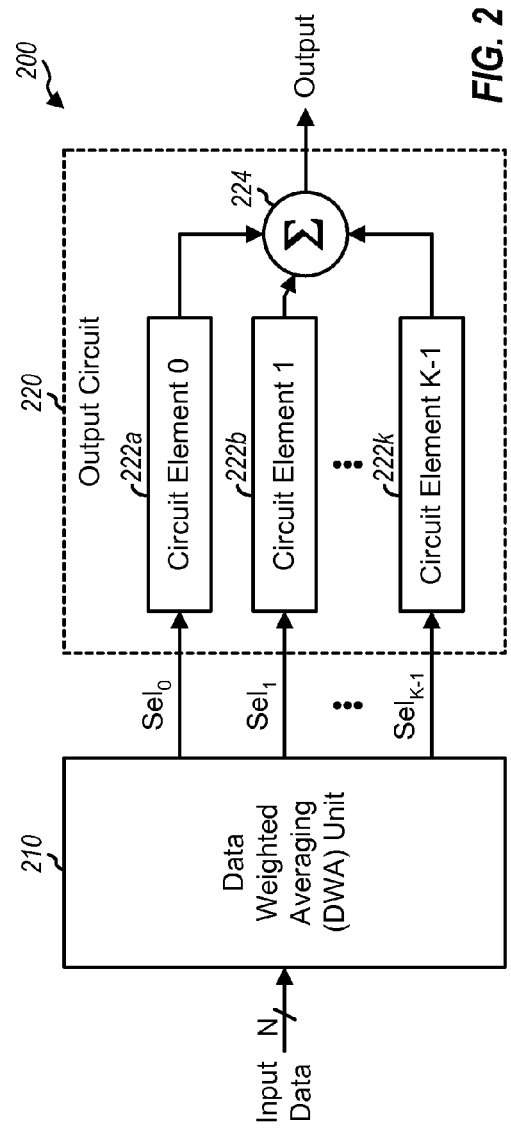

CIRCUIT AND METHOD FOR DYNAMICALLY SELECTING CIRCUIT ELEMENTS

CLAIM OF PRIORITY UNDER 35 U.S.C. §119

The present Application for Patent claims priority to Provisional Application No. 60/915,906 entitled "Zero-position-based Data Weight Average (DWA)" filed May 3, 2007, and assigned to the assignee hereof and hereby expressly incorporated by reference herein.

BACKGROUND

I. Field

The present disclosure relates generally to electronics circuits, and more specifically to techniques for dynamically selecting circuit elements.

II. Background

Digital-to-analog converters (DACs) are widely used for various applications such as audio, video, data conversion, etc. A DAC receives digital input data and provides an analog output signal. The performance of the DAC may be quantified by various dynamic specifications such as total harmonic distortion (THD), spurious free dynamic range (SFDR), signal-to-noise ratio (SNR), etc.

An N-bit DAC may be implemented with N binary weighted circuit elements, where a circuit element may be a current source, a capacitor, a resistor, etc. With binary weighting, the smallest circuit element has a size of one unit, the next smallest circuit element has a size of two units, and so on, and the largest circuit element has a size of $2^{N-1}$ units. In each sample period, zero or more of the N circuit elements may be selected by a digital input data value and used to generate an analog output value for that sample period. The performance of the DAC is dependent on the accuracy of the sizes of the N binary weighted circuit elements. Since the size of the largest circuit element is $2^{N-1}$ times the size of the smallest circuit element, it may be difficult to accurately match these circuit elements. Consequently, the performance of the binary-weighted DAC may be relatively poor.

An N-bit DAC may also be implemented with $2^N-1$ circuit elements of equal size. In each sample period, a digital input data value of x may select x circuit elements to generate an analog output value for that sample period. Since all of the circuit elements have the same size, it may be easier to match these circuit elements. Nevertheless, there may be limitations on how closely the $2^N-1$ circuit elements can be matched. Hence, some mismatches typically exist between these circuit elements. To improve performance in the presence of the mismatches, the circuit elements may be selected in a manner such that errors due to the mismatches may be shaped and pushed out of band.

There is therefore a need in the art for techniques to dynamically select circuit elements in order to mitigate deleterious effects due to circuit element mismatches.

SUMMARY

Techniques for dynamically selecting circuit elements in order to mitigate deleterious effects due to circuit element mismatches are described herein. According to an aspect, an apparatus includes first, second, and third circuits. The first circuit receives input data and provides a plurality of first signals that is asserted based on the input data. The first circuit may perform thermometer decoding on the input data and assert a number of first signals based on the input data. The second circuit receives the plurality of first signals and provides a plurality of second signals used to select a plurality of circuit elements, e.g., current sources, capacitors, resistors, etc. The third circuit generates a control for the second circuit, and the second circuit maps the plurality of first signals to the plurality of second signals based on this control.

In one design, the second circuit includes a plurality of multiplexers and a control circuit. Each multiplexer receives the plurality of first signals in a different order and provides one of the plurality of second signals. The plurality of multiplexers provide the plurality of first signals, circularly rotated by an amount determined by the control, as the plurality of second signals. The control circuit accumulates control data with the current value of the control to obtain a new value of the control. The control data may be the input data (for data weighted averaging), pseudo-random data, a fixed non-zero value, a value of zero, etc.

Various aspects and features of the disclosure are described in further detail below.

BRIEF DESCRIPTION OF THE DRAWINGS

FIG. 1 shows a block diagram of a DAC with thermometer decoding.

FIG. 2 shows a block diagram of a DAC with data weighted averaging (DWA).

DETAILED DESCRIPTION

Figure 3A:
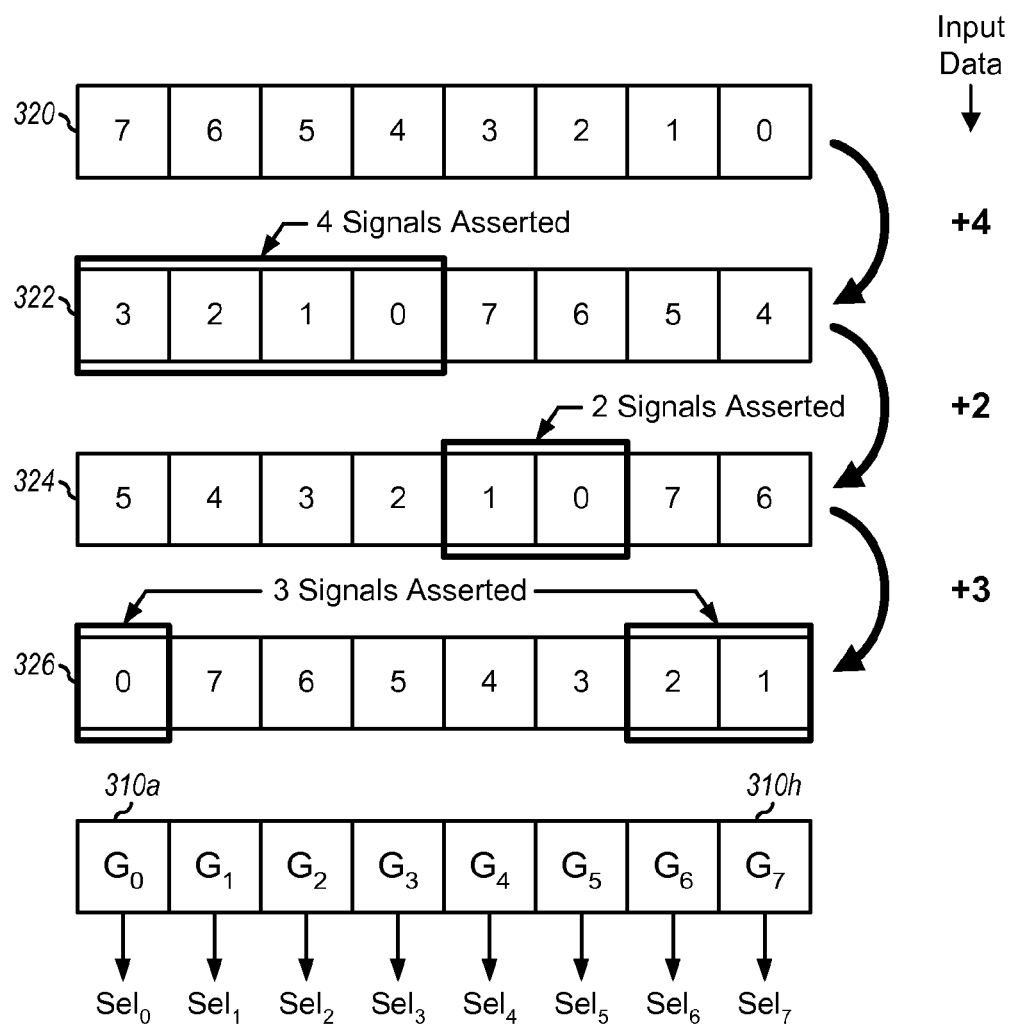
FIG. 3A shows a design of a DWA unit.

The dynamic element selection techniques described herein may be used for various circuits such as DACs, sigma-delta (ΣΔ) DACs, analog-to-digital converters (ADCs), ΣΔ ADCs, filters, etc. For clarity, the techniques are described below for DACs.

FIG. 1 shows a block diagram of a DAC 100 with thermometer decoding. DAC 100 includes a thermometer decoder 110 and an output circuit 120. Decoder 110 receives N-bit input data and provides K select signals $Sel_0$ through $Sel_{K-1}$, where N>1 and $K=2^N$. The terms "signals", "lines", "wires", etc., are often used interchangeably. In each sample period, decoder 110 may receive an input data value of x, assert the first x select signals $Sel_0$ through $Sel_{x-1}$, and de-assert the remaining K–x select signals $Sel_x$ through $Sel_{K-1}$. The number of select signals to assert in each sample period may be dependent on the input data value. Furthermore, the select signals may be asserted in a predetermined order so that the first x select signals are asserted for an input data value of x.

Output circuit 120 includes K circuit elements 122a through 122k that receive the K select signals $Sel_0$ through $\text{Sel}_{K-1}$, respectively. Each circuit element 122 may comprise a current source, a switch, a capacitor, a resistor, etc., or any combination thereof. Each circuit element 122 may be enabled when its select signal is asserted and disabled when its select signal is de-asserted. Each circuit element 122, when enabled, provides its output to a summer 124. Summer 124 sums the output of all K circuit elements 122a through 122k and provides an analog output signal.

Decoder 110 may assert the K select signals in a systematic/static manner based on the input data, as described above. The K circuit elements 122a through 122k would then be selected in a systematic manner. For example, an input data value of 1 may always select circuit element 122a, an input data value of 2 may always select circuit elements 122a and 122b, etc. Since there may be mismatches in the K circuit elements, the systematic selection of these circuit elements may result in the analog output signal having degraded performance, e.g., poor THD.

FIG. 2 shows a block diagram of a DAC 200 with data weighted averaging (DWA). DAC 200 includes a DWA unit 210 and an output circuit 220. DWA unit 210 receives N-bit input data and provides K select signals $\text{Sel}_0$ through $\text{Sel}_{K-1}$. In each sample period, DWA unit 210 may receive an input data value of x and assert x of the K select signals. The number of select signals to assert in each sample period may be dependent on the input data value. However, the select signals may be asserted in a different order based on the current input data value as well as the current state of DWA unit 210, as described below. Output circuit 220 includes K circuit elements 222a through 222k and a summer 224. The K circuit elements 222 may be dynamically selected by the K select signals from DWA unit 210.

FIG. 3A shows a design of DWA unit 210 in FIG. 2 for a case in which N=3 and K=8. In this design, DWA unit 210 includes eight select signal generators 310a through 310h that generate eight select signals $\text{Sel}_0$ through $\text{Sel}_7$, respectively. Generators 310a through 310h are also referred to as generators $G_0$ through $G_7$, respectively.

Figure 3B:
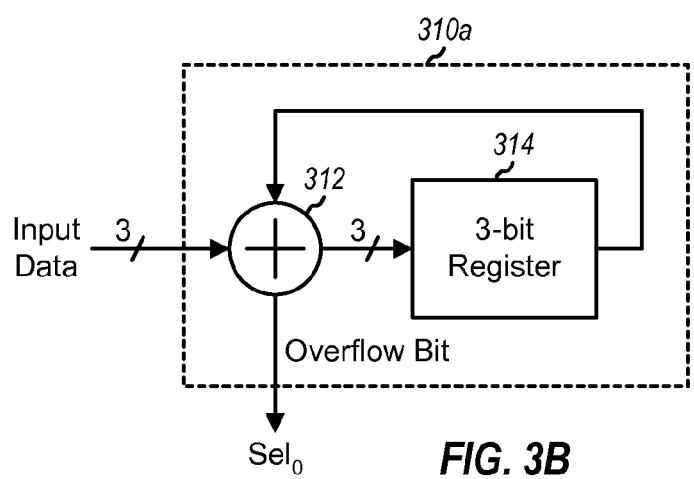
FIG. 3B shows a block diagram of a select signal generator in FIG. 3A.

FIG. 3B shows a block diagram of select signal generator 310a, which includes a 3-bit summer 312 and a 3-bit register 314. Summer 312 receives and sums a 3-bit input data value with a 3-bit stored value from register 314 and provides a 3-bit result to register 314. Summer 312 asserts select signal $\text{Sel}_0$ if there is an overflow when summing the input data value with the stored value and de-asserts select signal $\text{Sel}_0$ if there is no overflow.

Referring back to FIG. 3A, generators $G_0$ through $G_7$ may each be implemented as shown in FIG. 3B. The registers within generators $G_0$ through $G_7$ may be initialized with progressively decreasing values of 7 through 0, respectively, as shown in line 320. In the example shown in FIG. 3A, the first input data value is 4, the register in each generator is added by 4, and the updated register values for generators $G_0$ through $G_7$ are shown in line 322. The registers in generators $G_0$ through $G_3$ overflow when added with 4, and select signals $\text{Sel}_0$ through $\text{Sel}_3$ are asserted. The second input data value is 2, the register in each generator is added by 2, and the updated register values for generators $G_0$ through $G_7$ are shown in line 324. The registers in generators $G_4$ and $G_5$ overflow when added with 2, and select signals $\text{Sel}_4$ and $\text{Sel}_5$ are asserted. The third input data value is 3, the register in each generator is added by 3, and the updated register values for generators $G_0$ through $G_7$ are shown in line 326. The registers in generators $G_0$, $G_6$ and $G_7$ overflow when added with 3, and select signals $\text{Sel}_0$, $\text{Sel}_6$ and $\text{Sel}_7$ are asserted.

The DWA design in FIGS. 3A and 3B cycles through the eight circuit elements and selects as many circuit elements as indicated by an input data value. The eight registers in generators $G_0$ through $G_7$ store the current state of DWA unit 210. The last (or rightmost) select signal that is asserted is indicated by the register with a zero value, which is referred to as the zero position. Whenever a new input data value is received, zero or more select signals are asserted starting with the select signal that is immediately to the right of the current zero position. The number of select signals to assert, and hence the number of places to shift the zero position, is dependent on the input data value. The new zero position is equal to the previous zero position plus the current input data value. The zero position is shifted from left to right based on the input data value and wraps around to the left after reaching the rightmost position.

The zero position may be at one of eight possible places corresponding to the eight generators $G_0$ through $G_7$. Thus, depending on the current zero position, there are eight different ways to represent a given input data value. Which select signals to assert (and hence which circuit elements to select) is pseudo-randomized through the different possible ways of representing the input data based on the state of the registers.

The DWA design in FIGS. 3A and 3B employs K N-bit adders and K N-bit registers for an N-bit DAC. The registers may generate strong digital switching noise, which may adversely impact the performance of the DAC. Furthermore, the DWA unit has limited configurability.

Figure 4:
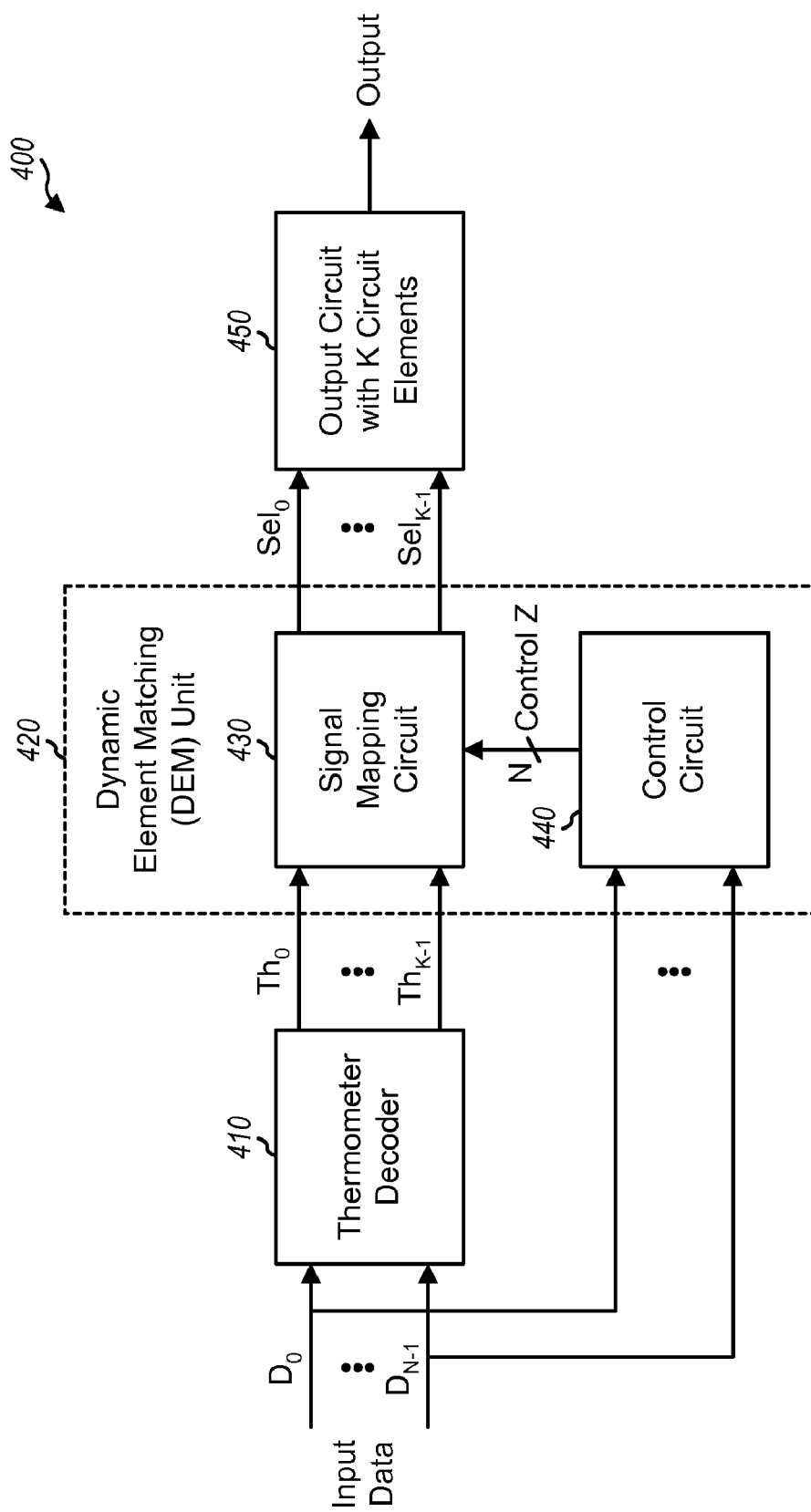
FIG. 4 shows a block diagram of a DAC with dynamic element matching (DEM).

FIG. 4 shows a block diagram of a design of a DAC 400 with dynamic element selection, which is also referred to as dynamic element matching (DEM). In this design, DAC 400 includes a thermometer decoder 410, a DEM unit 420, and an output circuit 450. Decoder 410 receives N-bit input data and provides K decoded signals $\text{Th}_0$ through $\text{Th}_{K-1}$. Decoder 410 may operate as described above for decoder 110 in FIG. 1. DEM unit 420 receives the K decoded signals and possibly the input data and provides K select signals $\text{Sel}_0$ through $\text{Sel}_{K-1}$. Output circuit 450 receives the K select signals and generates an analog output signal. Output circuit 450 may include K circuit elements that may be selected by the K select signals, as described above for output circuit 120 in FIG. 1.

In the design shown in FIG. 4, DEM unit 420 includes a signal mapping circuit 430 and a control circuit 440. Signal mapping circuit 430 receives the K decoded signals from decoder 410 and rearranges these signals to achieve pseudo-randomization. Different circuit behavior may be obtained by rearranging the K decoded signals in different manners. For example, signal mapping circuit 430 may circularly rotate the K decoded signals as described below to achieve the DWA behavior shown in FIG. 3A. Control circuit 440 generates a control Z that directs the operation of signal mapping circuit 430 and affects how the K select signals are generated. Control circuit 440 may flexibly support multiple modes of operation, as described below.

Figure 5A:
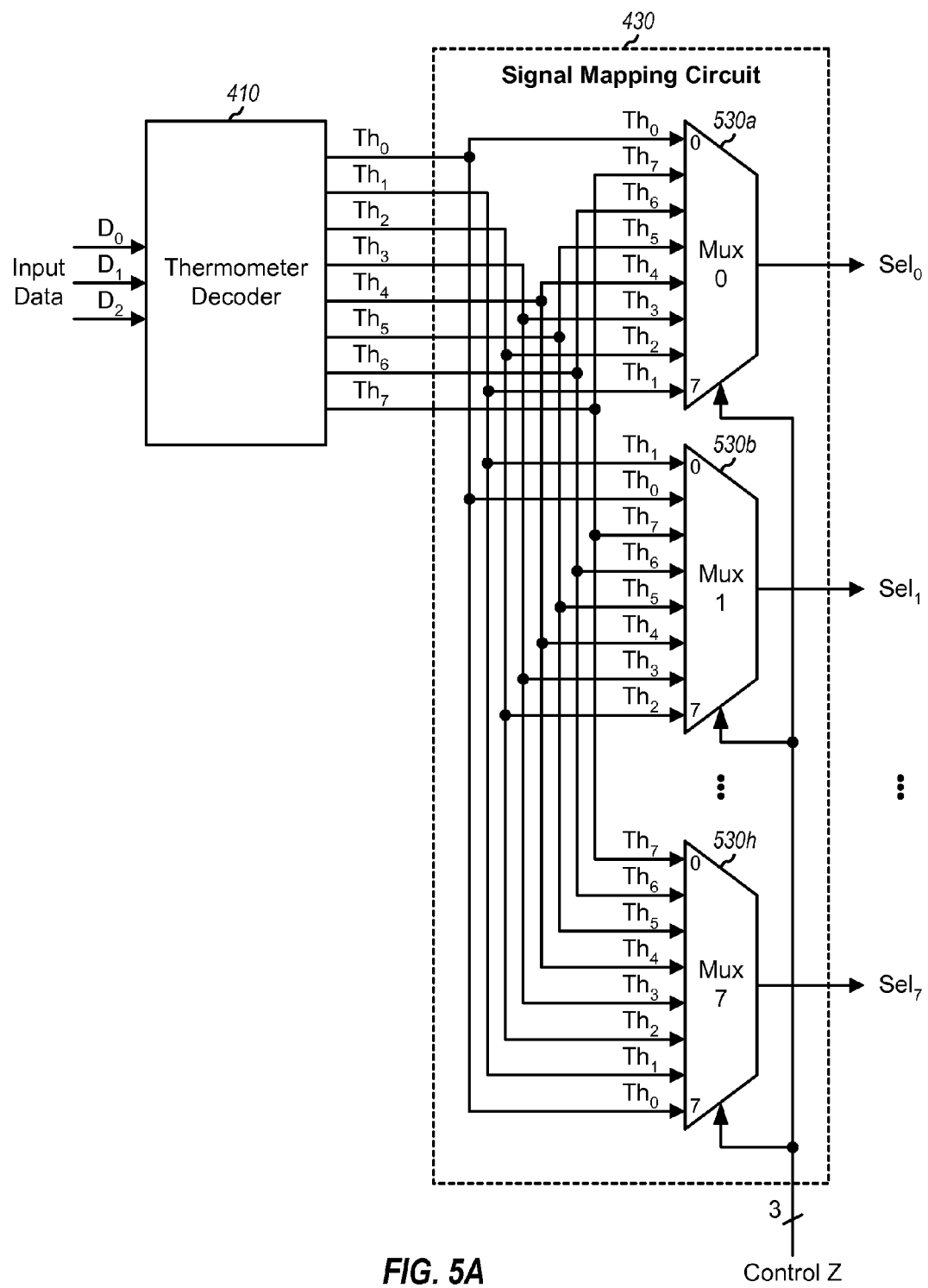
FIG. 5A shows a block diagram of a signal mapping circuit within the DEM unit.

FIG. 5A shows a block diagram of a design of signal mapping circuit 430 within DEM unit 420 in FIG. 4. FIG. 5A show a design for a case in which N=3 and K=8.

Thermometer decoder 410 receives 3-bit input data $D_0$, $D_1$ and $D_2$ and generates eight decoded signals $\text{Th}_0$ through $\text{Th}_7$. Decoder 410 asserts the decoded signals in a predetermined order, starting with decoded signal $\text{Th}_0$, based on the input data value.

Table 1 gives the logic value of the eight decoded signals $\text{Th}_0$ through $\text{Th}_7$ for each possible 3-bit input data value. As shown in Table 1, decoder 410 asserts only one decoded signal $\text{Th}_0$ for an input data value of 1, asserts two decoded signals $\text{Th}_0$ and $Th_1$ for an input data value of 2, and so on, and asserts seven decoded signals $Th_0$ through $Th_6$ for an input data value of 7.

TABLE 1

Thermometer Decoder Output

| Data Input | $Th_0$ | $Th_1$ | $Th_2$ | $Th_3$ | $Th_4$ | $Th_5$ | $Th_6$ | $Th_7$ |
|---|---|---|---|---|---|---|---|---|
| 0 | 0 | 0 | 0 | 0 | 0 | 0 | 0 | 0 |
| 1 | 1 | 0 | 0 | 0 | 0 | 0 | 0 | 0 |
| 2 | 1 | 1 | 0 | 0 | 0 | 0 | 0 | 0 |
| 3 | 1 | 1 | 1 | 0 | 0 | 0 | 0 | 0 |
| 4 | 1 | 1 | 1 | 1 | 0 | 0 | 0 | 0 |
| 5 | 1 | 1 | 1 | 1 | 1 | 0 | 0 | 0 |
| 6 | 1 | 1 | 1 | 1 | 1 | 1 | 0 | 0 |
| 7 | 1 | 1 | 1 | 1 | 1 | 1 | 1 | 0 |

Signal mapping circuit 430 receives the eight decoded signals $Th_0$ through $Th_7$ and provides eight select signals $Sel_0$ through $Sel_7$. In the design shown in FIG. 5A, signal mapping circuit 430 includes eight 8×1 multiplexers (Mux) 530a through 530h, which are also referred to as multiplexers 0 through 7, respectively. Each multiplexer has eight inputs that receive all eight decoded signals $Th_0$ through $Th_7$ from decoder 410. However, the eight decoded signals $Th_0$ through $Th_7$ are provided to multiplexers 0 through 7 in different orders to achieve rotation of the select signals that are asserted.

The eight decoded signals may be denoted by an 8-element set $T_0 = \{Th_0, Th_1, Th_2, Th_3, Th_4, Th_5, Th_6, Th_7\}$. A circular rotation of the eight decoded signals by m positions may be achieved by taking the first m elements in set $T_0$ and moving these m elements to the end of set $T_0$ obtain a circularly rotated set $T_m$. For example, a circular rotation of 1 position may be given as $T_1 = \{Th_1, Th_2, Th_3, Th_4, Th_5, Th_6, Th_7, Th_0\}$. The eight decoded signals $Th_0$ through $Th_7$ are provided directly to input 0 of multiplexers 0 through 7, respectively. The eight decoded signals circularly rotated by one position are provided to input 1 of the eight multiplexers. In general, the eight decoded signals circularly rotated by m positions are provided to input m of the eight multiplexers, where $0 \leq m \leq 7$.

Table 2 gives the mapping of the eight decoded signals to the eight inputs of each multiplexer. For example, multiplexer 0 receives decoded signal $Th_0$ at input 0, decoded signal $Th_7$ at input 1, and so on, and decoded signal $Th_1$ at input 7.

Figure 5B:
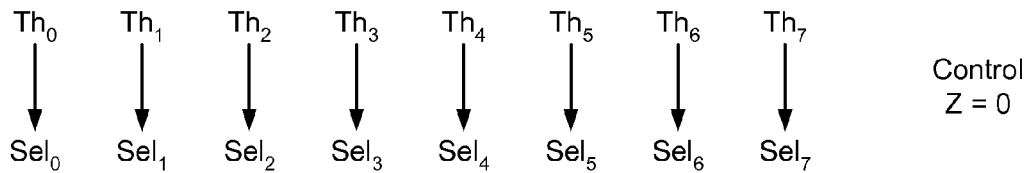
FIGS. 5B, 5C and 5D show mapping of the first/decoded signals to the second/select signals for control values of 0, 1 and 2, respectively.

FIG. 5B shows the mapping of the decoded signals to the select signals when control Z is equal to 0. Decoded signals $Th_0$ through $Th_7$ are provided directly as select signals $Sel_0$ through $Sel_7$, respectively, as shown by the line for Z=0 in Table 2. Select signal $Sel_0$ is asserted for an input data value of 1, select signals $Sel_0$ and $Sel_1$ are asserted for an input data value of 2, etc.

Figure 5C:
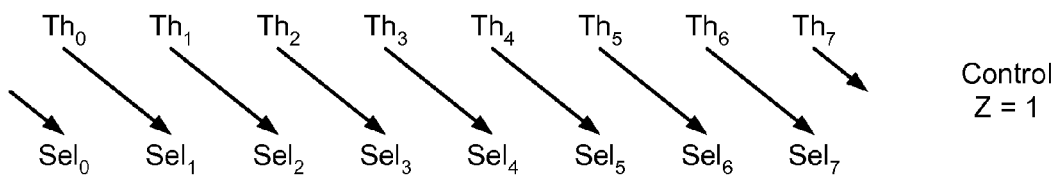

FIG. 5C shows the mapping of the decoded signals to the select signals when control Z is equal to 1. Decoded signals $Th_7, Th_0, \ldots, Th_6$ are provided as select signals $Sel_0$ through $Sel_7$, respectively, as shown by the line for Z=1 in Table 2. Select signal $Sel_1$ is asserted for an input data value of 1, select signals $Sel_1$ and $Sel_2$ are asserted for an input data value of 2, etc.

Figure 5D:
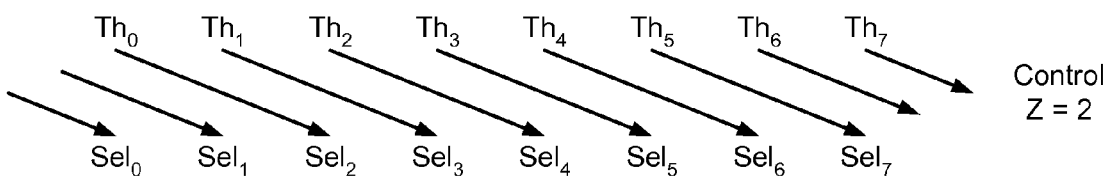

FIG. 5D shows the mapping of the decoded signals to the select signals when control Z is equal to 2. Decoded signals $Th_6, Th_7, Th_0, \ldots, Th_5$ are provided as select signals $Sel_0$ through $Sel_7$, respectively, as shown by the line for Z=2 in Table 2. Select signal $Sel_2$ is asserted for an input data value of 1, select signals $Sel_2$ and $Sel_3$ are asserted for an input data value of 2, etc.

The mapping of the decoded signals to the select signals for other values of control Z are shown in Table 2. Different select signals are asserted first for different values of control Z, as indicated by the shifting position of decoded signal $Th_0$ for different control Z values.

In the design shown in FIG. 5A, the eight decoded signals $Th_0$ through $Th_7$ are mapped to the inputs of multiplexers 0 through 7 such that signal mapping circuit 430 can implement the DWA design shown in FIG. 3A. The eight possible values for control Z correspond to eight possible zero positions in FIG. 3A, as shown by the position of decoded signal $Th_0$ in Table 2. Multiplexers 0 through 7 circularly rotate the decoded signals to achieve pseudo-randomization in the select signals.

FIG. 5A shows one design of mapping the decoded signals to the inputs of the multiplexers. The decoded signals may also be mapped to the inputs of the multiplexers based on some other mapping to achieve different output behavior. For example, the decoded signals may be mapped so that clock-

TABLE 2

| Mux Input | Mux 0 | Mux 1 | Mux 2 | Mux 3 | Mux 4 | Mux 5 | Mux 6 | Mux 7 | Control Z |
|---|---|---|---|---|---|---|---|---|---|
| 0 | $Th_0$ | $Th_1$ | $Th_2$ | $Th_3$ | $Th_4$ | $Th_5$ | $Th_6$ | $Th_7$ | Z = 0 |
| 1 | $Th_7$ | $Th_0$ | $Th_1$ | $Th_2$ | $Th_3$ | $Th_4$ | $Th_5$ | $Th_6$ | Z = 1 |
| 2 | $Th_6$ | $Th_7$ | $Th_0$ | $Th_1$ | $Th_2$ | $Th_3$ | $Th_4$ | $Th_5$ | Z = 2 |
| 3 | $Th_5$ | $Th_6$ | $Th_7$ | $Th_0$ | $Th_1$ | $Th_2$ | $Th_3$ | $Th_4$ | Z = 3 |
| 4 | $Th_4$ | $Th_5$ | $Th_6$ | $Th_7$ | $Th_0$ | $Th_1$ | $Th_2$ | $Th_3$ | Z = 4 |
| 5 | $Th_3$ | $Th_4$ | $Th_5$ | $Th_6$ | $Th_7$ | $Th_0$ | $Th_1$ | $Th_2$ | Z = 5 |
| 6 | $Th_2$ | $Th_3$ | $Th_4$ | $Th_5$ | $Th_6$ | $Th_7$ | $Th_0$ | $Th_1$ | Z = 6 |
| 7 | $Th_1$ | $Th_2$ | $Th_3$ | $Th_4$ | $Th_5$ | $Th_6$ | $Th_7$ | $Th_0$ | Z = 7 |
|   | $Sel_0$ | $Sel_1$ | $Sel_2$ | $Sel_3$ | $Sel_4$ | $Sel_5$ | $Sel_6$ | $Sel_7$ |   |

All eight multiplexers 0 through 7 receive the same 3-bit control Z. Control Z indicates the current zero position and may be generated as described below. When control Z is equal to m, the decoded signals at input m of multiplexers 0 through 7 are provided as select signals $Sel_0$ through $Sel_7$, respectively. Multiplexers 0 through 7 thus map decoded signals $Th_0$ through $Th_7$ to select signals $Sel_0$ through $Sel_7$ based on the current zero position indicated by control Z.

wise rotation or counter-clockwise rotation may be achieved, e.g., based on the sign of the input data. In any case, the mapping of the decoded signals to the select signals allows the K circuit elements in output circuit 450 to be dynamically selected to combat mismatches in these circuit elements.

Figure 6:
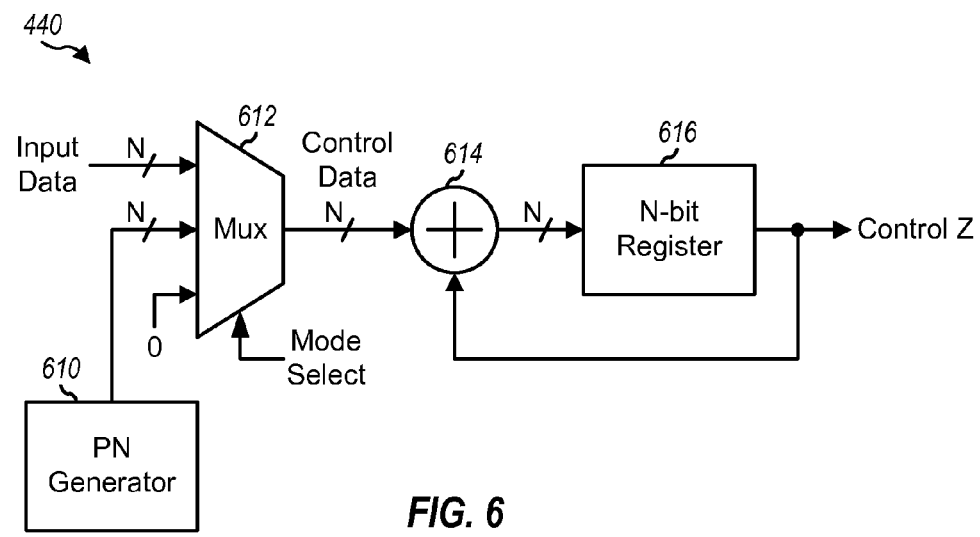
FIG. 6 shows a block diagram of a control circuit within the DEM unit.

FIG. 6 shows a block diagram of a design of control circuit 440 within DEM unit 420 in FIG. 4. In this design, DEM unit 420 supports the modes of operation shown in Table 3.

TABLE 3

Modes of Operation

| Mode | Description |
| --- | --- |
| DWA | The select signals are generated using the input data. |
| Pseudo-random | The select signals are generated using pseudo-random data. |
| Bypass | The decoded signals are provided directly as the select signals. |

In the DWA mode, the zero position is updated based on the input data, and the select signals are asserted starting with the select signal at the current zero position. In the pseudo-random mode, the zero position is updated based on pseudo-random data, and the select signals are asserted starting with the select signal at the current zero position. The DWA mode and the pseudo-random mode differ in how the zero position is updated. The zero position may also be updated in other manners, e.g., based on a fraction of the input data, based on a combination of the input data and pseudo-random data, based on a fixed non-zero value, etc. In the bypass mode, the select signals are essentially generated based on thermometer decoding, without any randomization. Other modes of operation may also be supported. For example, the zero position may be updated by a fixed non-zero value (e.g., 1, 2, etc.) in each sample period and may thus be shifted at a constant rate.

Within DEM unit 420, a multiplexer 612 receives the input data at a first input, pseudo-random data from a pseudo-random number (PN) generator 610 at a second input, and a value of 0 at a third input. Multiplexer 612 provides the input data when the DWA mode is selected, the pseudo-random data when the pseudo-random mode is selected, and 0 when the bypass mode is selected, as indicated by a mode select. A summer 614 sums the control data from multiplexer 612 with the current control value from a register 616 and provides an updated control value to register 616. Register 616 provides the current control value as the N-bit control Z to signal mapping circuit 430.

Summer 614 and register 616 implement a wrap-around accumulator that updates the zero position based on the control data from multiplexer 612. In the DWA mode, the zero position is updated based on the input data from multiplexer 612. In the pseudo-random mode, the zero position is updated based on the pseudo-random data from multiplexer 612. In the bypass mode, register 616 is initialized to zero, and the zero position is updated with 0 from multiplexer 612 and hence does not change.

PN generator 610 may be implemented with a linear feedback shift register (LFSR) having a length greater than N. The LFSR may implement any primitive polynomial generator function. The N least significant bits (LSBs) of the LFSR may be provided as N-bit pseudo-random data. The pseudo-random data may also be obtained in other manners, e.g., with a look-up table.

Figure 7:
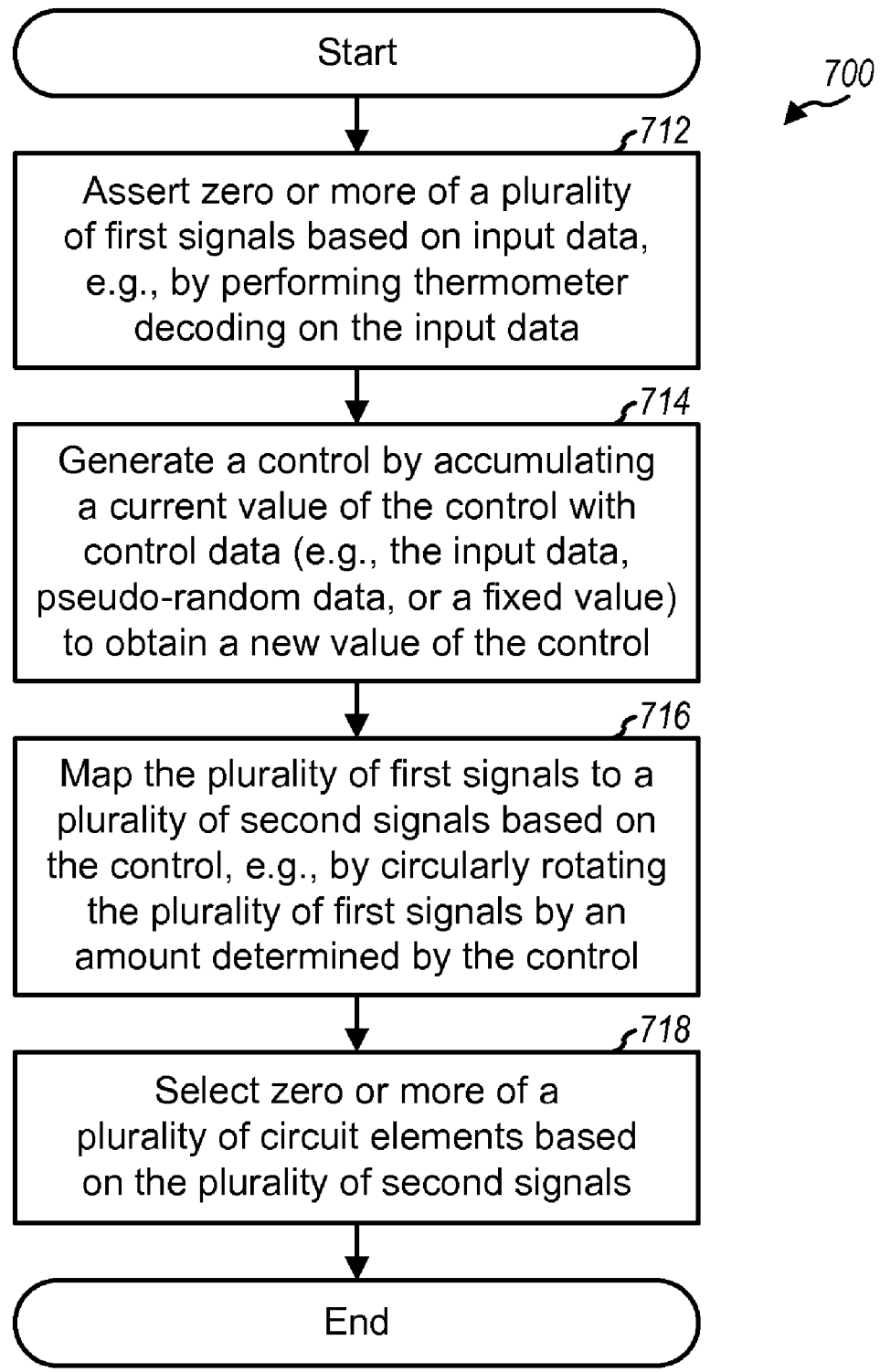
FIG. 7 shows a process for dynamically selecting circuit elements.

FIG. 7 shows a design of a process 700 for dynamically selecting circuit elements, e.g., in a DAC or some other circuit. Zero or more of a plurality of first signals may be asserted in a predetermined order based on input data, e.g., by performing thermometer decoding on the input data (block 712). A control may be generated by accumulating the current value of the control with control data to obtain a new value of the control (block 714). The control data may be the input data, pseudo-random data, a fixed non-zero value, zero, etc. The plurality of first signals may be mapped to a plurality of second signals based on the control (block 716). The control may indicate the next second signal to assert for the next input data value. The first and second signals may correspond to the decoded and select signals, respectively, described above. The plurality of first signals may be circularly rotated by an amount determined by the control and provided as the plurality of second signals. Zero or more of a plurality of circuit elements may be selected based on the plurality of second signals (block 718). For DWA, the plurality of second signals may select the plurality of circuit elements in a sequential order, starting with the circuit element that is immediately after the last selected circuit element. The number of first signals to assert, and hence the number of second signals to assert, may be determined by the input data.

Figure 8:
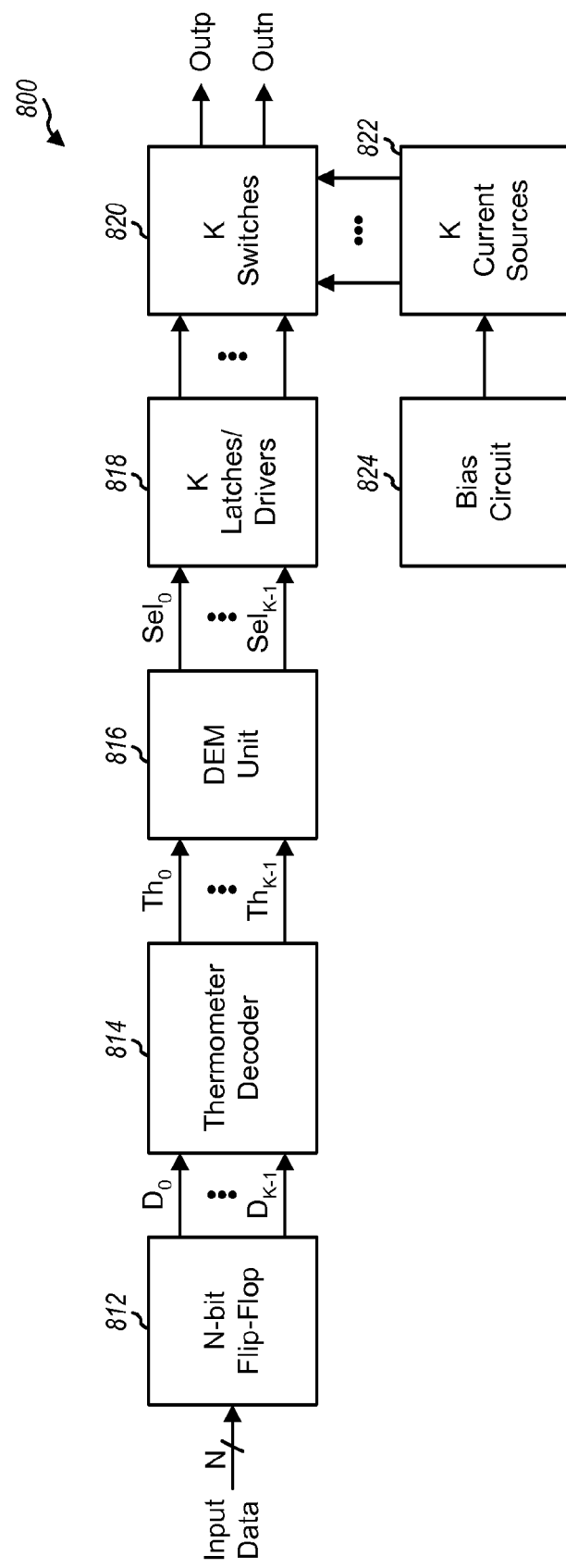
FIG. 8 shows a block diagram of a DAC with DEM.

FIG. 8 shows a block diagram of a design of a DAC 800 with DEM. In this design, DAC 800 includes K current sources 822 that generate K reference currents of equal amount. Mismatches in the K reference currents may be ameliorated by dynamically selecting the K reference currents.

Within DAC 800, an N-bit flip-flop 812 receives N-bit input data, clocks the input data with a clock, and provides N synchronized data bits $D_0$ through $D_{N-1}$ in each sample period. A thermometer decoder 814 receives the N data bits and provides K decoded signals $Th_0$ through $Th_{K-1}$. A DEM unit 816 receives the K decoded signals $Th_0$ through $Th_{K-1}$ and provides K select signals $Sel_0$ through $Sel_{K-1}$. DEM unit 816 may be implemented with DEM unit 420 shown in FIGS. 4 through 6.

K latches/drivers 818 receive the K select signals and provide K control signals for K switches 820. K switches 820 also receive the K reference currents of equal amount from K current sources 822. Each of the K switches 820 steers its reference current to either an Outp output or an Outn output based on its control signal. Latches 818 ensure synchronous switching of the K reference currents in order to reduce glitch energy in the Outp or Outn signals. A bias circuit 824 generates a bias voltage for K current sources 822.

FIG. 8 shows a DAC design in which thermometer decoding is performed for all N bits. In general, a DAC may be implemented with one or more sections, and each section may be implemented with thermometer decoding or binary decoding. For example, a DAC may be implemented with two sections—a first section for M most significant bits (MSBs) among the N total bits, and a second section for L LSBs among the N total bits, where N=M+L. Each section may be implemented with thermometer decoding and DEM as described above.

The dynamic element selection techniques described herein may provide certain advantages. The techniques may be used to flexibly support different modes such as those given in Table 3. The techniques may also support various randomization schemes through flexibility in the design of the signal mapping circuit and the control circuit. Furthermore, the control circuit may be initialized to zero (for the bypass mode) or an arbitrary value (for the other modes), which avoids the need for special initialization circuitry such as the one required for the DWA design shown in FIG. 3A. The techniques may also generate less switching noise due to the use of fewer sequential logics, which may improve performance for sensitive analog circuits.

The techniques described herein may be used for various electronics devices such as wireless communication devices, handheld devices, gaming devices, computing devices, computers, laptop computers, consumer electronics devices, etc. An exemplary use of the techniques for a wireless communication device is described below.

Figure 9:
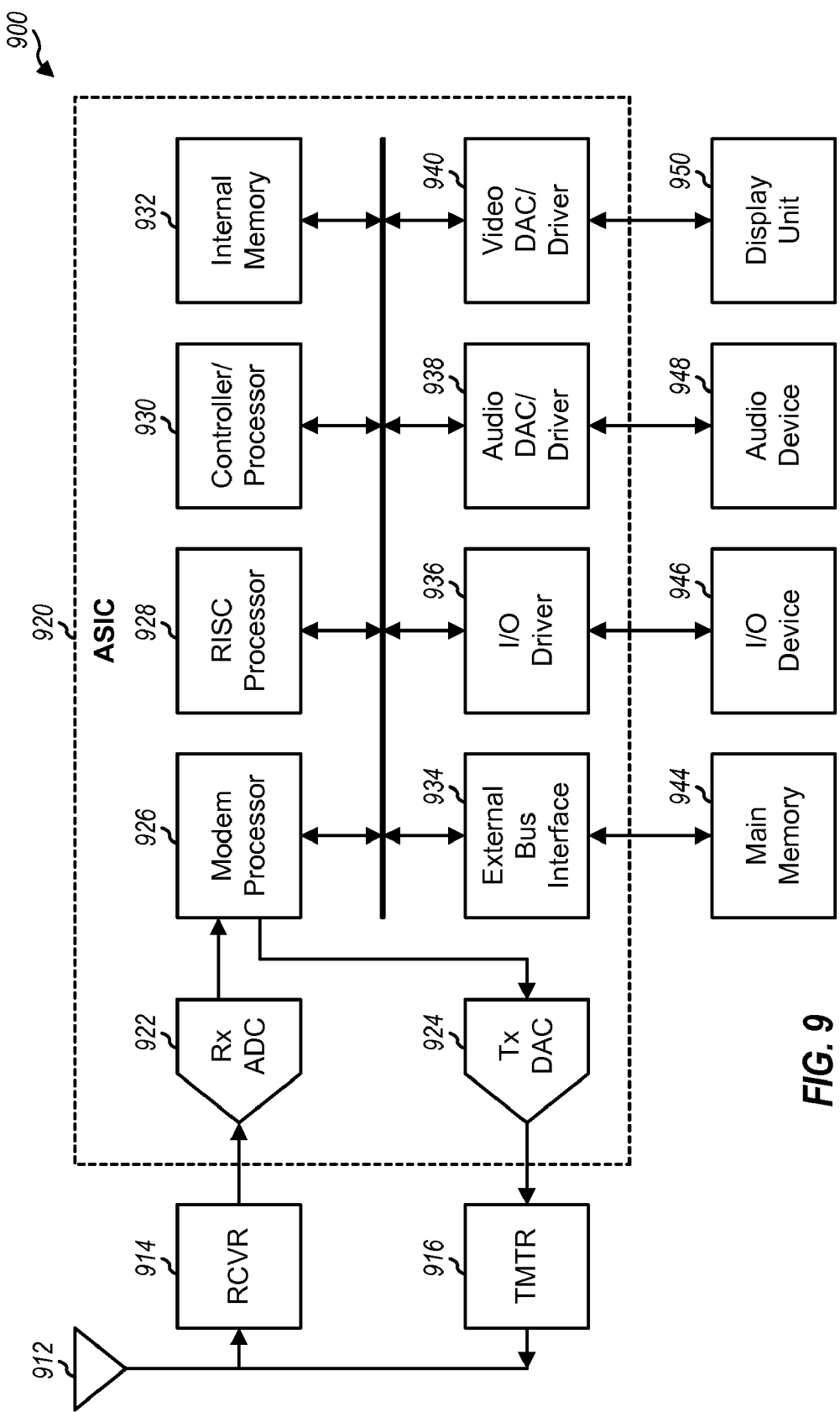
FIG. 9 shows a block diagram of a wireless communication device.

FIG. 9 shows a block diagram of a design of a wireless communication device 900 in a wireless communication system. Wireless device 900 may be a cellular phone, a terminal, a handset, a personal digital assistant (PDA), etc. The wireless communication system may be a Code Division Multiple Access (CDMA) system, a Global System for Mobile Communications (GSM) system, etc.

Wireless device 900 is capable of providing bi-directional communication via a receive path and a transmit path. On the receive path, signals transmitted by base stations (not shown) are received by an antenna 912 and provided to a receiver (RCVR) 914. Receiver 914 conditions the received signal and provides an analog input signal to an application specific integrated circuit (ASIC) 920. On the transmit path, a transmitter (TMTR) 916 receives and conditions an analog output signal from ASIC 920 and generates a modulated signal, which is transmitted via antenna 912 to the base stations.

ASIC 920 may include various processing, interface, and memory units such as, e.g., a receive ADC (Rx ADC) 922, a transmit DAC (Tx DAC) 924, a modem processor 926, a reduced instruction set computing (RISC) processor 928, a controller/processor 930, an internal memory 932, an external bus interface 934, an input/output (I/O) driver 936, an audio DAC/driver 938, and a video DAC/driver 940. Rx ADC 922 digitizes the analog input signal from receiver 914 and provides digital samples to modem processor 926. Tx DAC 924 converts digital output chips from modem processor 926 to analog and provides the analog output signal to transmitter 916. Modem processor 926 performs processing for data transmission and reception, e.g., encoding, modulation, demodulation, decoding, etc. RISC processor 928 may perform various types of processing for wireless device 900, e.g., processing for video, graphics, higher layer applications, etc. Controller/processor 930 may direct the operation of various processing and interface units within ASIC 920. Internal memory 932 stores data and/or instructions for various units within ASIC 920.

EBI 934 facilitates transfer of data between ASIC 920 and a main memory 944. I/O driver 936 drives an I/O device 946 via an analog or digital interface. Audio DAC/driver 938 drives an audio device 948, which may be a speaker, a headset, an earpiece, etc. Video DAC/driver 940 drives a display unit 950, which may be a liquid crystal display (LCD), etc. Rx ADC 922, Tx DAC 924, audio DAC/driver 938, video DAC/driver 940, and/or other units may implement the techniques described herein. For example, any of the DACs may be implemented as shown in FIG. 8.

The techniques described herein may be implemented in various hardware units such as an integrated circuit (IC), an ASIC, a digital signal processor (DSP), a digital signal processing device (DSPD), a programmable logic device (PLD), a field programmable gate array (FPGA), a controller, a processor, and other electronic devices. The hardware units may be fabricated in various IC process technologies such as complementary metal oxide semiconductor (CMOS), N-channel MOS (NMOS), P-channel MOS (PMOS), bipolar-CMOS (Bi-CMOS), bipolar, etc. The hardware units may be fabricated with any device size technology, e.g., 130 nanometer (nm), 90 nm, 65 nm, 45 nm, 32 nm, etc.

The techniques described herein may be used for Tx DACs, $\Sigma\Delta$ DACs, audio DACs, video DACs, instrumentation DACs, Rx ADCs, $\Sigma\Delta$ ADCs, filters, etc. The DACs and ADCs may be implemented with P-FETs, N-FETs, bipolar junction transistors (BJTs), GaAs transistors, hetero-junction bipolar transistors (HBTs), high electron mobility transistors (HEMTs), etc. The DACs and ADCs may also be fabricated on various types of IC such as analog ICs, digital ICs, mixed signal ICs, radio frequency ICs (RFICs), etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
    a first circuit to receive input data and provide a plurality of first signals asserted based on the input data;
    a second circuit to receive the plurality of first signals and provide a plurality of second signals used to select a plurality of circuit elements; and
    a third circuit to generate a control for the second circuit, the second circuit mapping the plurality of first signals to the plurality of second signals based on the control from the third circuit, the mapping including circularly rotating the plurality of first signals by an amount determined by the control.

2. The apparatus of claim 1, wherein the plurality of second signals select the plurality of circuit elements in a sequential order.

3. The apparatus of claim 1, wherein the first circuit asserts a number of first signals based on the input data, and wherein the number of second signals asserted is equal to the number of first signals asserted.

4. The apparatus of claim 1, wherein the first circuit performs thermometer decoding on the input data and provides thermometer decoded signals as the plurality of first signals.

5. The apparatus of claim 1, wherein the second circuit comprises
    a plurality of multiplexers, each multiplexer receiving the plurality of first signals in a different order and providing one of the plurality of second signals.

6. The apparatus of claim 5, wherein the plurality of multiplexers receive the control from the third circuit and provide the plurality of first signals, circularly rotated by an amount determined by the control, as the plurality of second signals.

7. The apparatus of claim 1, wherein the third circuit stores a value indicative of a next second signal to assert for a next input data value.

8. The apparatus of claim 1, wherein the third circuit comprises
    a register to store a current value of the control, and
    a summer to receive and sum control data and the current value from the register and to provide a new value of the control to the register.

9. The apparatus of claim 8, wherein the control data is the input data.

10. The apparatus of claim 8, wherein the control data is pseudo-random data, a fixed non-zero value, or a fixed value of zero.

11. The apparatus of claim 8, wherein the third circuit comprises
    a multiplexer to receive the input data and pseudo-random data at two inputs and to provide the control data to the summer.

12. An integrated circuit comprising:
    a first circuit to receive input data and provide a plurality of first signals asserted based on the input data;
    a second circuit to receive the plurality of first signals and provide a plurality of second signals used to select a plurality of circuit elements; and
    a third circuit to generate a control for the second circuit, the second circuit mapping the plurality of first signals to the plurality of second signals based on the control from the third circuit, the mapping including circularly rotating the plurality of first signals by an amount determined by the control.

13. The integrated circuit of claim 12, wherein the first circuit performs thermometer decoding on the input data and provides thermometer decoded signals as the plurality of first signals.

14. The integrated circuit of claim 12, wherein the second circuit comprises
    a plurality of multiplexers to provide the plurality of first signals, circularly rotated by an amount determined by the control, as the plurality of second signals.

15. The integrated circuit of claim 12, wherein the third circuit comprises
    a register to store a current value of the control, and
    a summer to receive and sum a current value from the register with the input data, pseudo-random data, or a fixed value and to provide a new value of the control to the register.

16. A method comprising:
    asserting zero or more of a plurality of first signals based on input data;
    mapping the plurality of first signals to a plurality of second signals based on a control; and
    selecting zero or more of a plurality of circuit elements based on the plurality of second signals, the mapping including circularly rotating the plurality of first signals by an amount determined by the control.

17. The method of claim 16, wherein the asserting zero or more of the plurality of first signals comprises
    asserting zero or more of the plurality of first signals based on thermometer decoding of the input data.

18. The method of claim 16, wherein the mapping the plurality of first signals to the plurality of second signals comprises
    providing the plurality of first signals, circularly rotated by an amount determined by the control, as the plurality of second signals.

19. The method of claim 16, further comprising:
    accumulating a current value of the control with the input data, pseudo-random data, or a fixed value to obtain a new value of the control.

20. An apparatus comprising:
    means for asserting zero or more of a plurality of first signals based on input data;
    means for mapping the plurality of first signals to a plurality of second signals based on a control; and
    means for selecting zero or more of a plurality of circuit elements based on the plurality of second signals, the mapping including circularly rotating the plurality of first signals by an amount determined by the control.

21. The apparatus of claim 20, wherein the means for asserting zero or more of the plurality of first signals comprises means for asserting zero or more of the plurality of first signals based on thermometer decoding of the input data.

22. The apparatus of claim 20, wherein the means for mapping the plurality of first signals to the plurality of second signals comprises means for providing the plurality of first signals, circularly rotated by an amount determined by the control, as the plurality of second signals.

23. The apparatus of claim 20, further comprising:

means for accumulating a current value of the control with the input data, pseudo-random data, or a fixed value to obtain a new value of the control.

24. An apparatus comprising a digital-to-analog converter (DAC) for converting digital input data to an analog output signal, the DAC including:

a plurality of circuit elements of equal size and used to generate the analog output signal;

a thermometer decoder to receive the digital input data and provide a plurality of first signals; and a dynamic element matching (DEM) unit to receive the plurality of first signals and provide a plurality of second signals used to select the plurality of circuit elements, the DEM unit mapping the plurality of first signals to the plurality of second signals based on a control, the mapping including circularly rotating the plurality of first signals by an amount determined by the control.

25. The apparatus of claim 24, wherein the DEM unit comprises a plurality of multiplexers, each multiplexer receiving the plurality of first signals in a different order and providing one of the plurality of second signals, and a control circuit to generate the control for the plurality of multiplexers.

26. The apparatus of claim 25, wherein the control circuit accumulates the digital input data with a current value of the control to obtain a new value of the control, the current value indicating a next second signal to assert for a next input data value.

27. The apparatus of claim 24, wherein the plurality of circuit elements comprise a plurality of current sources providing equal amount of current.

28. The apparatus of claim 24, wherein the plurality of circuit elements comprise a plurality of capacitors or a plurality of resistors of equal size.

* * * * *